(12) United States Patent
Ikeda et al.

(10) Patent No.: US 8,866,282 B2
(45) Date of Patent: Oct. 21, 2014

(54) SEMICONDUCTOR APPARATUS, SIGNAL TRANSMISSION SYSTEM AND SIGNAL TRANSMISSION METHOD

(75) Inventors: Yasuhiro Ikeda, Fujisawa (JP); Yutaka Uematsu, Kawasaki (JP); Satoshi Muraoka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 93 days.

(21) Appl. No.: 13/586,104

(22) Filed: Aug. 15, 2012

(65) Prior Publication Data
US 2013/0207234 A1 Aug. 15, 2013

(30) Foreign Application Priority Data
Dec. 19, 2011 (JP) .................... 2011-276620

(51) Int. Cl.
| | |
|---|---|
| *H01L 23/52* | (2006.01) |
| *H04L 25/02* | (2006.01) |
| *H05K 1/02* | (2006.01) |
| *H01L 49/02* | (2006.01) |
| *H01L 23/12* | (2006.01) |

(52) U.S. Cl.
CPC ............. *H01L 28/20* (2013.01); *H04L 25/02* (2013.01); *H05K 1/02* (2013.01); *H01L 2224/16225* (2013.01); *H01L 23/12* (2013.01)
USPC ............ 257/691; 257/E23.01; 257/E23.141; 257/E23.169

(58) Field of Classification Search
USPC ............ 257/691, E23.01, E23.141, E23.142, 257/E23.144, E23.151, E23.169, E23.175
See application file for complete search history.

(56) References Cited

U.S. PATENT DOCUMENTS

| | | | | |
|---|---|---|---|---|
| 8,053,911 | B2 * | 11/2011 | Hayashi et al. ............... | 257/798 |
| 2004/0196682 | A1 * | 10/2004 | Funaba et al. ................ | 365/149 |
| 2005/0110543 | A1 * | 5/2005 | Touya et al. .................. | 327/165 |
| 2006/0103418 | A1 * | 5/2006 | Hargrove et al. .............. | 326/21 |

FOREIGN PATENT DOCUMENTS

JP 2004-281960 A 10/2004

* cited by examiner

*Primary Examiner* — Benjamin Sandvik
*Assistant Examiner* — Leslie Pilar Cruz
(74) *Attorney, Agent, or Firm* — Foley & Lardner LLP

(57) ABSTRACT

A slew rate of a signal transmitted between a semiconductor device having a small load capacitance and a semiconductor device having a large load capacitance is improved. When a signal is transmitted to the semiconductor device (for example, a memory device) having the large load capacitance, pre-emphasis is performed, and when a signal is transmitted to the semiconductor device (for example, a memory controller) having the small load capacitance, pre-emphasis is not performed or is slightly performed. By this, when the signal is transmitted to the memory device, blunting in signal rising due to the load capacitance is suppressed, and when the signal is transmitted to the memory controller, ringing due to the reflection of the signal is suppressed, and the slew rate of the data transmission is improved.

14 Claims, 10 Drawing Sheets

$C_1 \ll C_2$
$Z_0 + R_a > Z_a$
$R_a = Z_0 - Z_a$
$L_a < L_0$

COMPARATIVE EXAMPLE

EMBODIMENT

SEMICONDUCTOR APPARATUS, SIGNAL TRANSMISSION SYSTEM AND SIGNAL TRANSMISSION METHOD

CROSS-REFERENCE TO RELATED PATENT APPLICATIONS

Japan Priority Application 2011-276620, filed Dec. 19, 2011 including the specification, drawings, claims and abstract, is incorporated herein by reference in its entirety.

BACKGROUND OF THE INVENTION

1. Field of the Invention

The present invention relates to a signal transmission technique to transmit a signal between semiconductor devices.

2. Description of the Related Art

In recent years, a demand for a low-cost, high-speed and large-capacity information processing apparatus increases, and in accordance with the speed-up of the processing speed and the increase of the capacity, the speed-up of signal transmission is requested.

In a signal waveform transmitted by a signal transmission system, there is a problem of influence of rising/falling waveform blunting due to dielectric loss in a signal transmitting process in a lossy signal wiring, skin effect or the like. In a related art signal transmission system, when the load capacitance of a semiconductor device is large, there is a problem that a signal slew rate at the time of data writing becomes blunt, data transmission speed is decreased, and data transmission speed at the time of data reading is also limited.

Then, patent literature 1 (JP-A-2004-281960) discloses that in a signal transfer system, "A resistor R=Zpcb−Zpkg having a value of difference between characteristic impedances (Zpcb, Zpkg) of both wirings is inserted between an intermediate board wiring and a printed board wiring. At this time, an output impedance Rout of a driver of a signal transfer master and a signal transfer slave is made smaller than the intermediate board wiring impedance Zpkg, and an input impedance Rin of a receiver is made substantially equal to the intermediate board wiring impedance Zpkg." By this, the signal is subjected to pre-emphasis and the slew rate is controlled.

However, in the invention disclosed in the patent literature 1, a consideration is not given to the difference between the characteristics of the semiconductor devices to transmit and receive a signal.

In the invention disclosed in the patent literature 1, when load capacitances at the time of data reading and writing of both the semiconductor devices are different, transmission speed may be limited to the transmission speed at which the signal can be transmitted to the semiconductor device having a large load capacitance. Besides, when a signal is transmitted to the semiconductor device having a small load capacitance, there arises a problem that ringing due to multiple reflection increases.

SUMMARY OF THE INVENTION

An object of the invention is to provide a technique which improves the quality of a signal transmitted between semiconductor devices having different characteristics.

In order to solve the problem, according to an aspect of the invention, when a signal is transmitted to a semiconductor device having a large load capacitance, pre-emphasis is performed, and when a signal is transmitted to a semiconductor device having a small load capacitance, pre-emphasis is not performed or is slightly performed.

According to the aspect of the invention, when a signal is transmitted to the semiconductor device having the large load capacitance, blunting in the signal rising due to the load capacitance is suppressed, and when a signal is transmitted to the semiconductor device having the small load capacitance, ringing due to the reflection of the signal is suppressed, and the slew rate of the signal transmitted between the semiconductor devices having different load capacitances can be improved.

DESCRIPTION OF EMBODIMENTS

Hereinafter, embodiments of the invention will be described with reference to the drawings.

Embodiment 1

Figure 1:
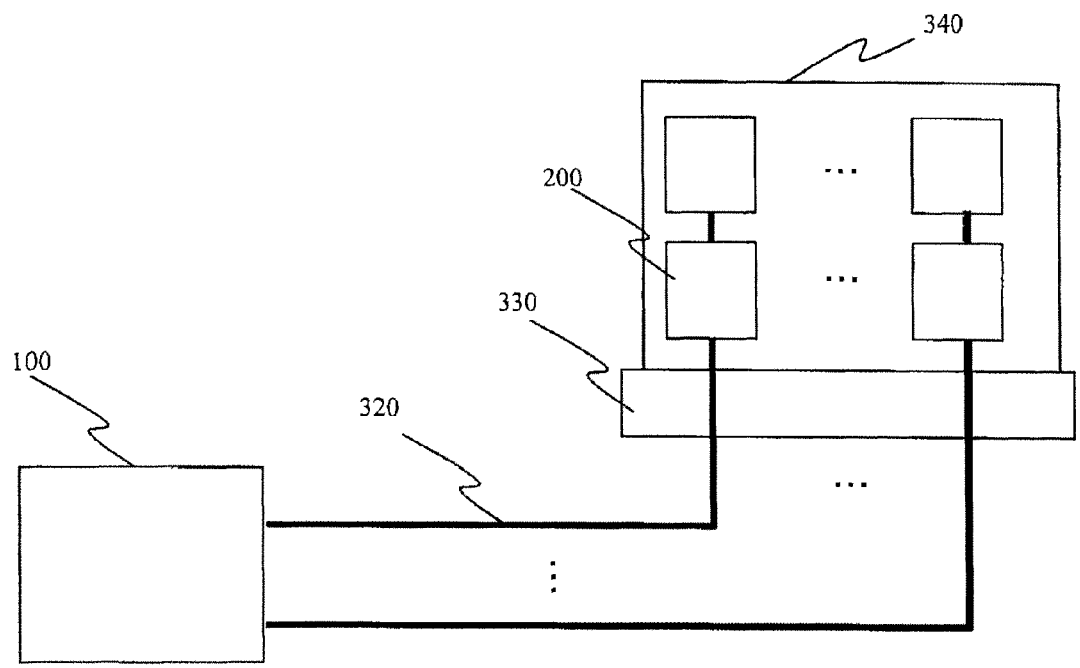
FIG. 1 is an example of a structural view of a signal transmission system of a first embodiment of the invention.

FIG. 1 is a structural view of a storage device of an embodiment. A memory controller 100 and a DIMM connector 330 are provided on a board, and a DIMM board 340 on which plural memory devices (flash memories) 200 are mounted is inserted onto the DIMM connector 330. The memory controller 100 is connected to a signal transmission path (not shown) to perform input and output to the outside, and is connected via a wiring 320 provided on the board and the DIMM board 340 and through the DIMM connector 330. The wiring 320 includes an electrode pad (not shown) on the board, and is connected to the memory controller 100 through BGA. Similarly, the wiring includes an electrode pad also on the DIMM board, and is connected to the memory device 200 through BGA.

A signal transmission system between the memory controller 100 and the memory device 200 uses source synchronous transmission, and a clock/strobe signal is transmitted in addition to data to be stored in the memory device. By this signal, the data of a received signal is decided. These signals are transmitted at the same period as the data signal or at a faster period.

Figure 2:
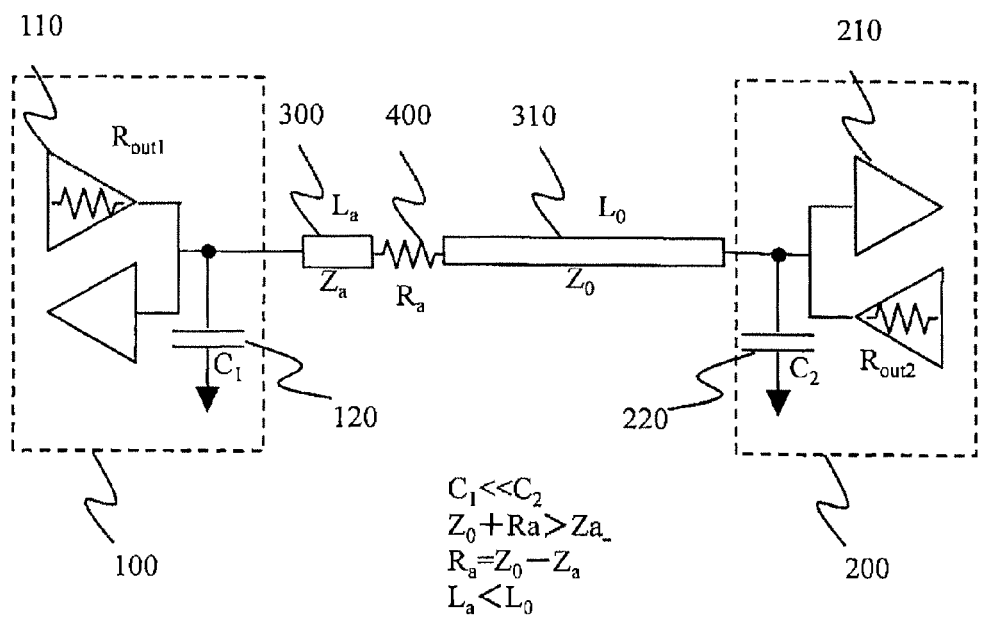
FIG. 2 is an example of a structural view of a main part of the signal transmission system of the first embodiment of the invention.

FIG. 2 is an example of a structural view of a main part of the storage device of the embodiment. The memory controller 100 is connected to the memory device (flash memory) 200 via the wiring. The memory controller 100 and the memory device 200 respectively have input capacitances C1 and C2, and the input capacitance C2 of the memory device 200 is much larger than the input capacitance C1 of the memory controller 100. The memory controller 100, the memory device 200 and the wiring are provided on the board and the DIMM board.

In the wiring, a first wiring 300, a resistance device 400 and a second wiring 310 are connected in series in this order from the memory controller 100 side, and the wiring is connected to the memory controller 100 and the memory device 200 by a wiring pad (not shown) and a BGA (not shown). The inside on-resistance of the memory controller 100 is resistance Rout1, the first wiring 300 has impedance Za, the resistance device 400 has resistance Ra, and the second wiring 310 has impedance Z0. Although the impedance of the second wiring 310 at the DIMM connector 330 through which the wiring passes on the way is different from that at the other portion, the impedance is made as constant as possible, and in the following, the impedance is regarded as substantially constant. Besides, the length of the first wiring is La, and the length of the second wiring is L0.

First, the case of writing will be described. At the time of writing, a signal transmitted from the memory controller 100 transmits through the first wiring 300, the resistance device 400 and the second wiring 310 in this order, and reaches the memory device 200. At this time, the relation of the above wirings is as follows.

$$Z0+Ra>Za \quad (1)$$

$$La<1T*v/2 \quad (2)$$

First, from the relation of mathematical expression (1), a reflected wave is generated between Za and Ra due to an impedance mismatch. Further, as defined in mathematical expression (2), a reciprocating delay time (reciprocating time is the time from the transmission of a signal to the time when the signal returns after passing through a wiring and being reflected by the wiring end) td1 in the wiring 300 is made shorter than the period T of the signal. That is, td1<1T is required to be satisfied. Here, since La is La=td1*(signal transmission speed v)/2, the length La of the wiring 300 is required to satisfy La<1T*v/2. The speed v is v=c/√(∈r). Where, c denotes the light speed in vacuum, and ∈r denotes the dielectric constant of a dielectric substance used for the board.

By this, waveform shaping by pre-emphasis to emphasize the rising/falling waveform of the signal waveform transmitted from the semiconductor device (100) can be performed by the reflected wave generated due to the occurrence of the impedance mismatch between Za and Ra.

The memory device 200 has the large input capacitance C2 as compared with the memory controller 100. Especially, in the case of a storage device using a flash memory, the input (load) capacitance of the flash memory is large, and the input voltage width required at the time of data writing is wide. Thus, a problem that the signal transmission speed at the time of data writing is reduced becomes remarkable. However, in this embodiment, blunting of the signal due to the large input capacitance C2 is suppressed by performing pre-emphasis on the transmitted signal, and the slew rate of the signal transmitted to the memory device 200 is improved.

Next, the case of reading will be described. At the time of reading, a signal transmitted from the memory device 200 transmits through the second wiring 310, the resistance device 400 and the first wiring 300 in this order, and reaches the memory controller 100. At this time, the relation of the above wirings is as follows.

$$Za+Ra=Z0 \quad (3)$$

$$L0>1T*v/2 \quad (4)$$

When data is read from the memory device 200 to the memory controller (semiconductor device) 100, the load capacitance of the memory controller 100 is small (C1<C2), and the time constant C1·Rout2 is small as compared with that at the time of data writing. Thus, even if pre-emphasis is not performed, the slew rate is not much reduced. Thus, Za+Ra=Z0 is made to be established, so that impedance matching between the second wiring 310 and the resistance device 400 is ensured, and reflection noise is prevented from occurring. Incidentally, the impedances of the wiring 300 and the wiring 310 have a relation of Za<Z0.

On the other hand, if pre-emphasis is performed on the signal transmitted from the memory device 200 to the memory controller 100, the slew rate becomes high and reflection becomes large, the waveform is vibrated (ringing) by multiple reflection between the transmitting end and the transmitting end, and the signal quality is degraded. Especially, if there is no termination, the ringing becomes large.

Figure 5:
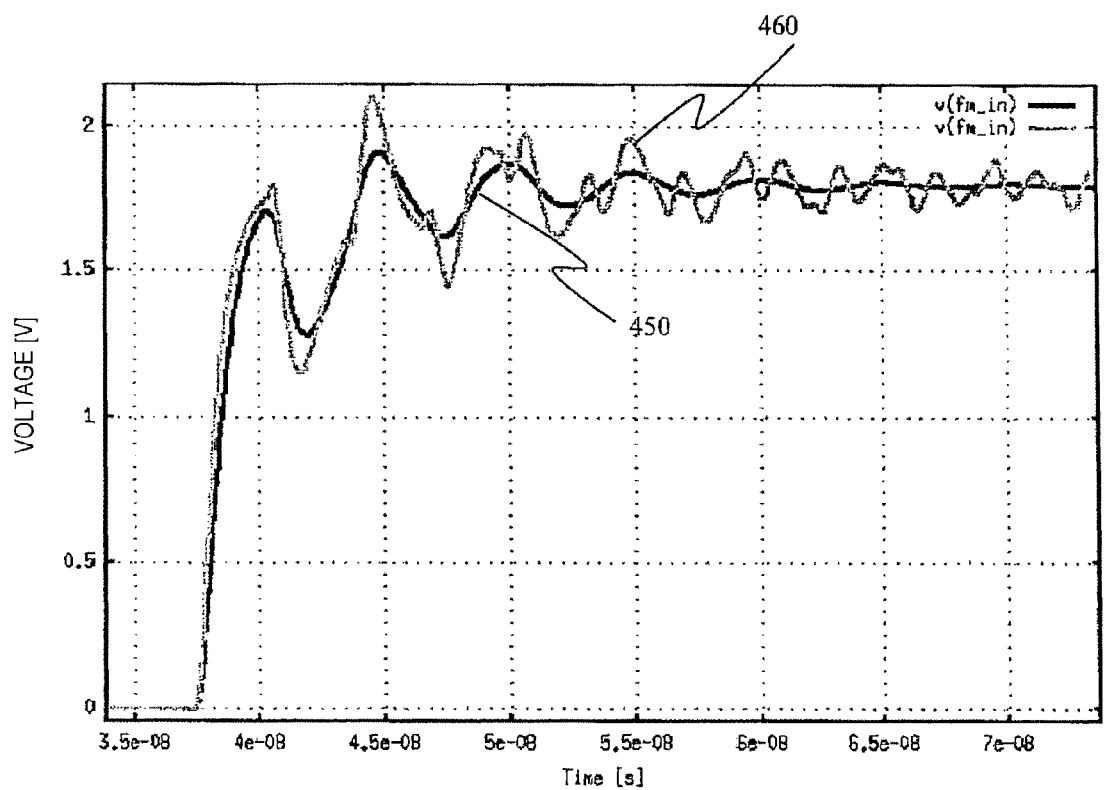
FIG. 5 is a view for explaining a waveform when ringing occurs.

FIG. 5 shows a waveform in the case where ringing occurs. When the ringing occurs, it is understood that the signal vibrates and is degraded. A signal 450 represents a case where a resistance device exists on wiring, and a signal 460 represents a case where a resistance device does not exist on wiring. Especially, it is understood that when there is no resistance, the ringing is large.

Even when pre-emphasis is not performed, ringing may occur. However, if the resistance device 400 is inserted as in this embodiment, the ringing can be damped, and degradation can be suppressed.

Incidentally, in this embodiment, the relation defined in mathematical expression (3) is made to be established, so that the impedance matching is performed. However, no limitation is made to this, and even if impedance mismatch occurs, if it is small, the generated pre-emphasis is also small, and ringing is also small. That is, the impedance mismatch (left side of mathematical expression (5)) when a signal advances from the first wiring 300 to the resistance device 400 has only to be larger than the impedance mismatch (right side of mathematical expression (5)) when a signal advances from the second wiring 310 to the resistance device 400.

$$Z0+Ra-Za>Za+Ra-Z0 \quad (5)$$

When mathematical expression (5) is modified, the impedance relation Za<Z0 of the first wiring 300 and the second wiring 310 is derived. In addition to this, as defined in mathematical expression (2) and mathematical expression (4), the first wiring 300 is made short, and the second wiring 310 is made long. As a result, pre-emphasis is performed on the signal transmitted from the memory controller 100 to the memory device 200, pre-emphasis is not performed on the signal transmitted from the memory device 200 to the memory controller 100 or the pre-emphasis is suppressed to be small as compared with that for the opposite direction signal, ringing is suppressed, and the slew rate can be improved.

Figure 3A:
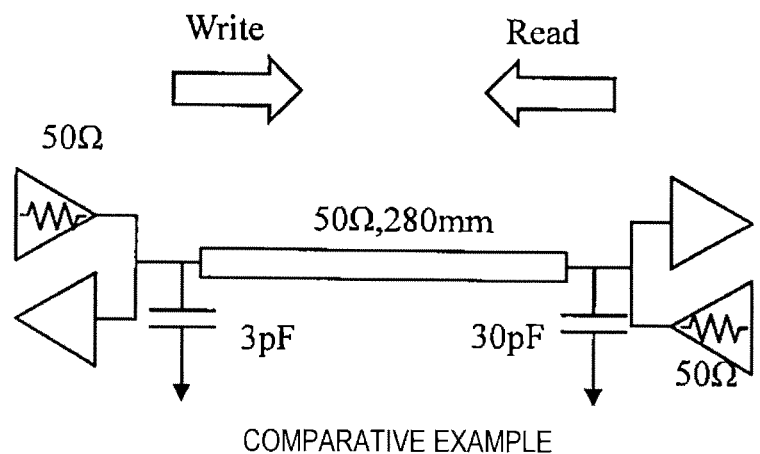
FIG. 3A is an explanatory view of an analysis model of a comparative example.
Figure 3B:
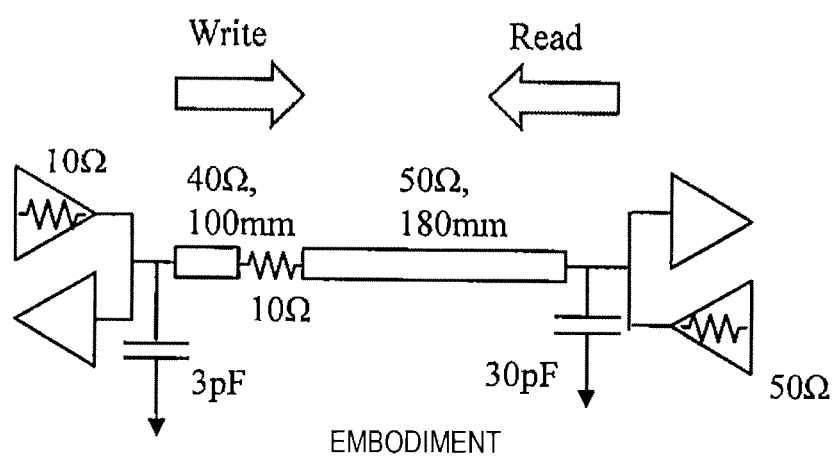
FIG. 3B is an explanatory view of an analysis model of the first embodiment of the invention.

FIGS. 3A and 3B show analysis models in wiring structures of a comparative example and this embodiment in order to confirm the effect of the embodiment. FIG. 3A shows the wiring structure model of the comparative example, and FIG. 3B shows the wiring structure model of the embodiment. In the analysis model of the wiring structure of the comparative example, a resistance device does not exist on the wiring, the wiring has a substantially uniform impedance, and the pre-emphasis does not occur.

FIGS. 4A to 4D show effects obtained from the analysis. The condition for the analysis results of FIGS. 4A to 4D is as follows. The transmission speed of a signal is 166 Mbps, the on-resistance Rout1 of the semiconductor device 100 is 10Ω, the characteristic impedance of the board wiring 300 is 40 Ω, 100 mm, the resistance device 400 has 10Ω, the board wiring 310 has 50Ω, 180 mm, the load capacitance C1 of the semiconductor device 100 is 3 pF, and the load capacitance C2 of the memory device 200 is 30 pF.

Figure 4A:
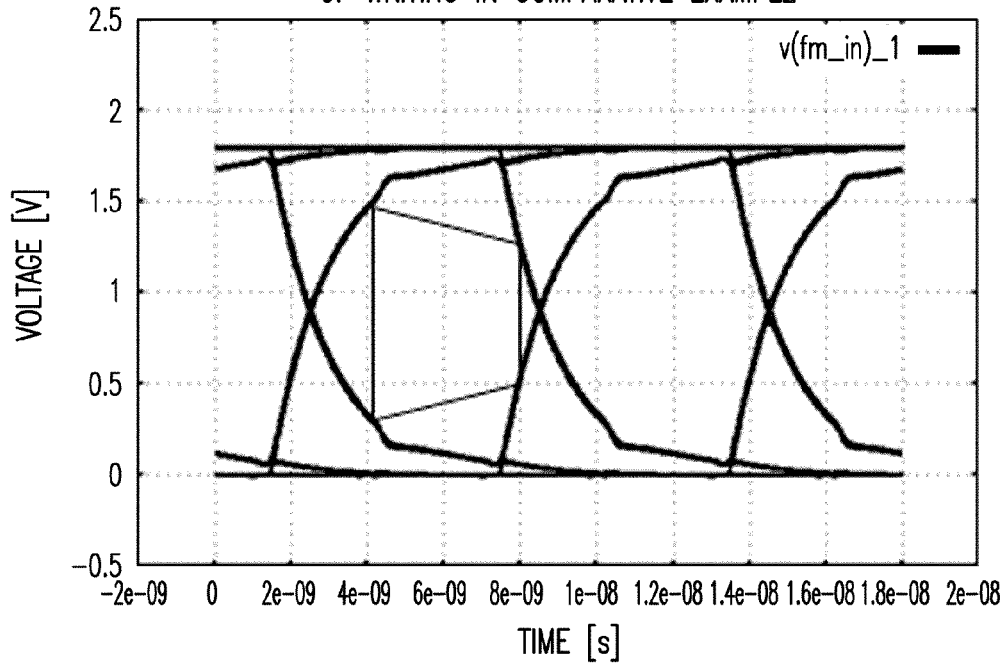
FIGS. 4A and 4B show receiving end waveforms of the comparative example.
Figure 4B:
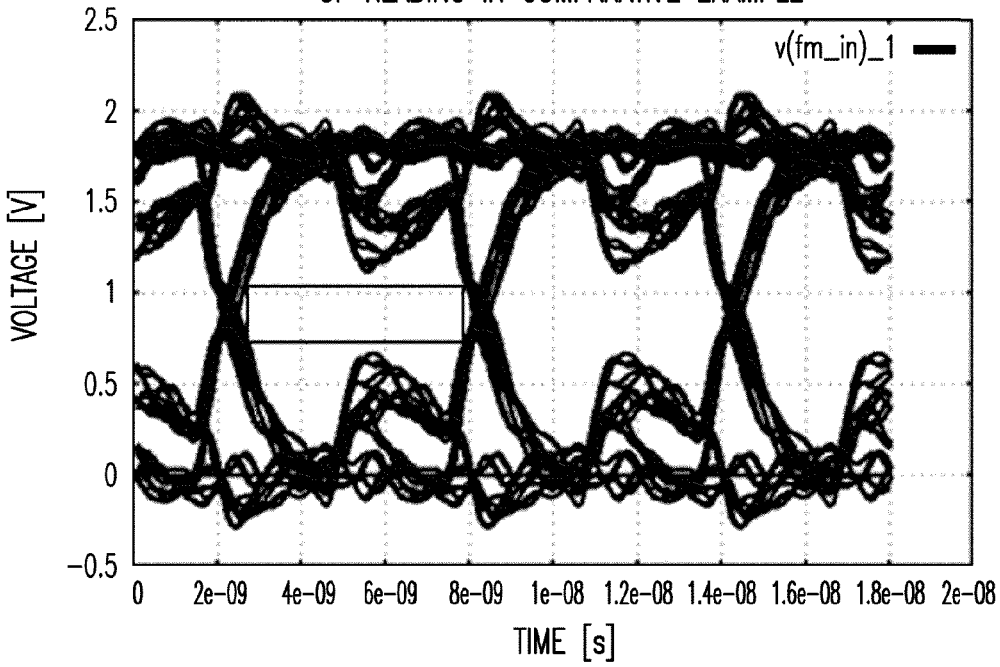
Figure 4C:
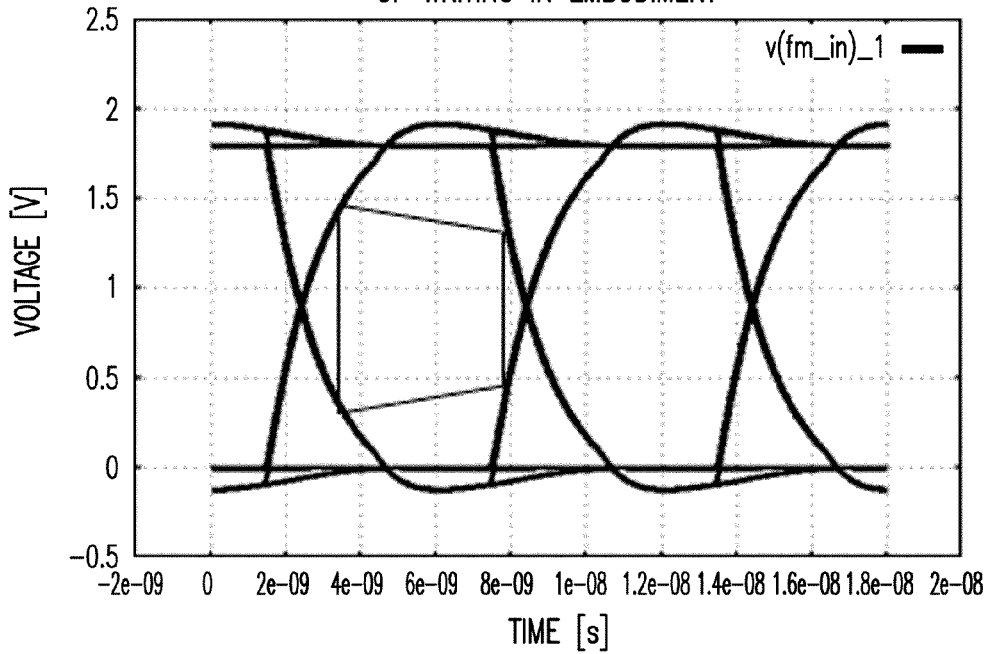
FIGS. 4C and 4D show receiving end waveforms of the first embodiment of the invention.

From FIGS. 4A to 4D, it is understood that in this embodiment, the structure of realizing passive pre-emphasis waveform generation is adopted, so that the slew rate reduction of the signal at data writing is suppressed, and signal identification in the reception circuit is facilitated. From the comparison between FIG. 4A and FIG. 4C showing the receiving end waveforms at the time of writing, it is understood that in this embodiment, a signal identifiable time indicated by a trapezoid in the drawing becomes long by the pre-emphasis.

Figure 4D:
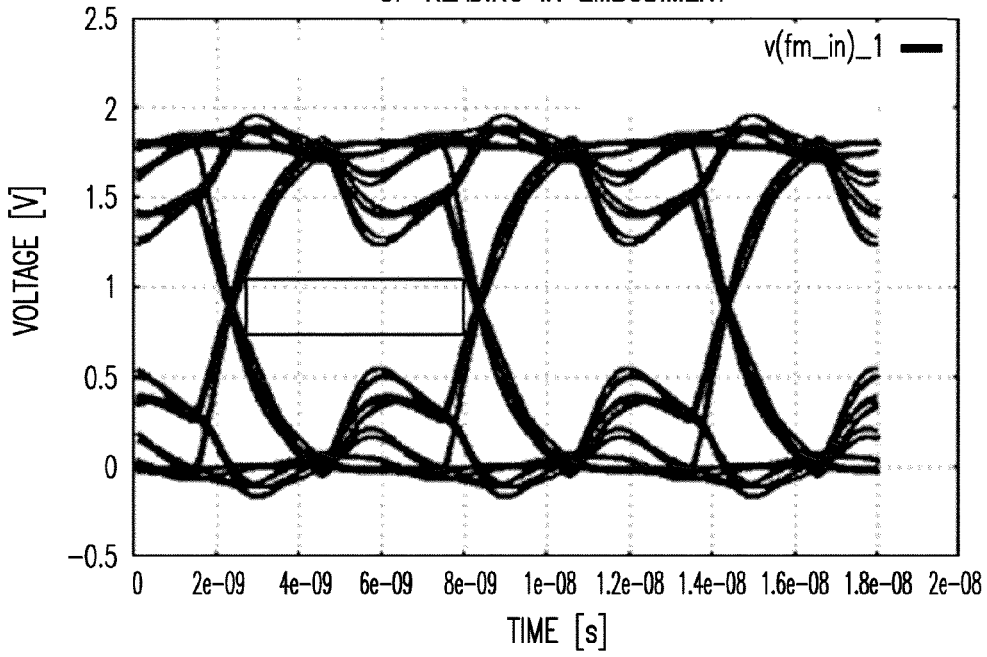

Besides, it is understood that ringing at the time of reading resistance device data can be suppressed. From the comparison between FIG. 4B and FIG. 4D showing receiving end waveforms at the time of reading, it is understood that in this embodiment, the signal oscillation width is small.

According to this embodiment, when a device having a large load capacitance, such as a memory device, and a device having a small load capacitance, such as a memory controller, are connected through a wiring, and signal transmission and reception is performed, the signal degradation is suppressed and the slew rate can be improved.

Embodiment 2

In this embodiment, a description will be made on an example of a case where plural memory devices each having a small load capacitance are connected, and the whole of the memory devices has a large load capacitance.

Figure 6:
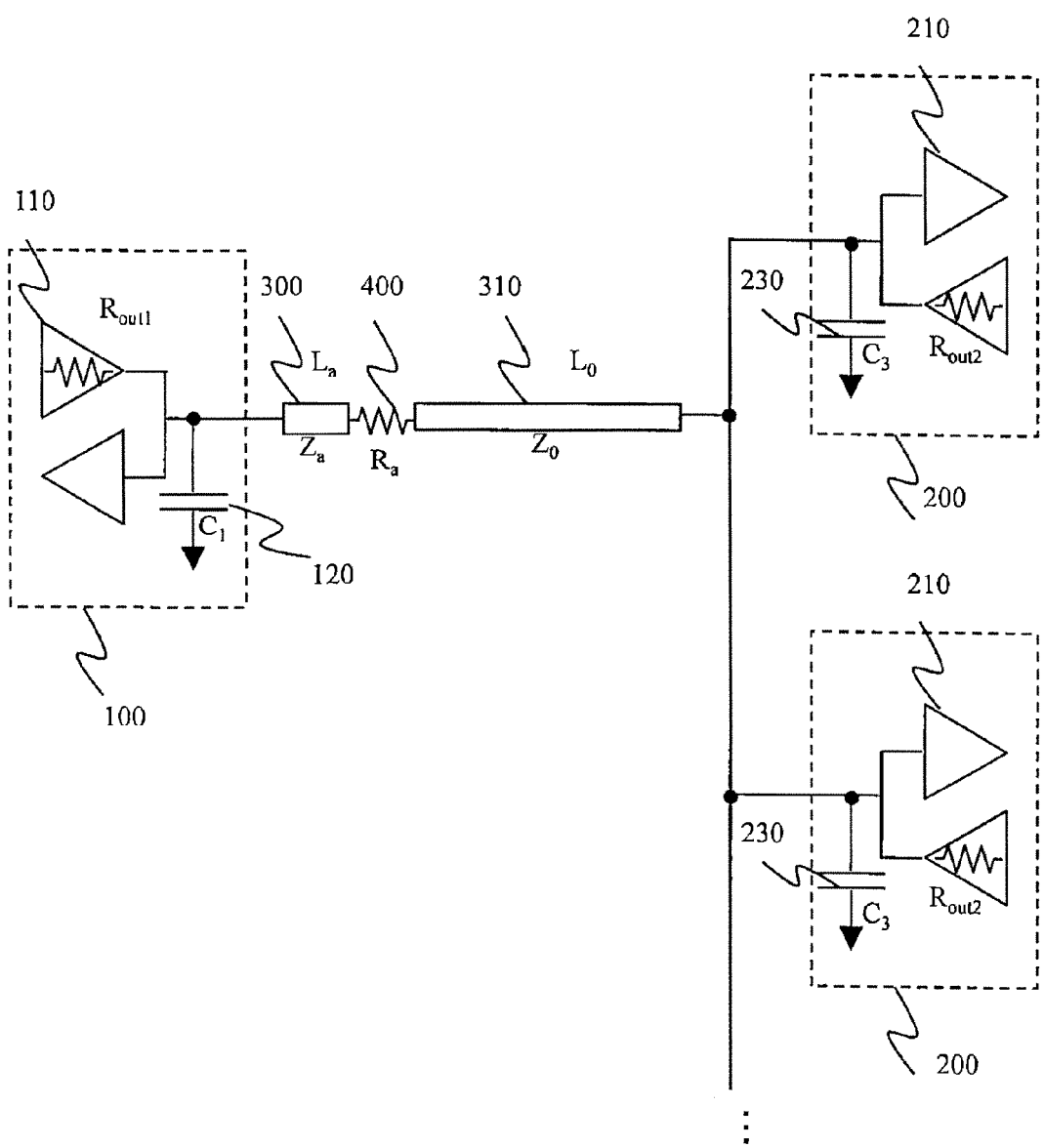
FIG. 6 is an example of a structural view of a signal transmission system of a second embodiment of the invention.

FIG. 6 is a view showing a signal transmission system in which plural memory devices 200 are connected. For example, when the memory device is a DRAM, a load capacitance C3 of the memory device 200 is not very large, or may be smaller than C1. However, when plural devices are connected, the load capacitance seen from the memory controller 100 may be large. Also in this case, if the relation among a wiring 300, a resistance device 400 and a wiring 310 is defined similarly to embodiment 1, the same effect is obtained.

The feature of embodiment 2 is that even when memory capacity is increased by connecting plural memory devices, the effect of embodiment 1 can be realized.

Embodiment 3

In this embodiment, a description will be made on an example of a case where in a mounting form similar to embodiment 1, an inserted resistance device is realized by a collective resistance device.

Figure 7:
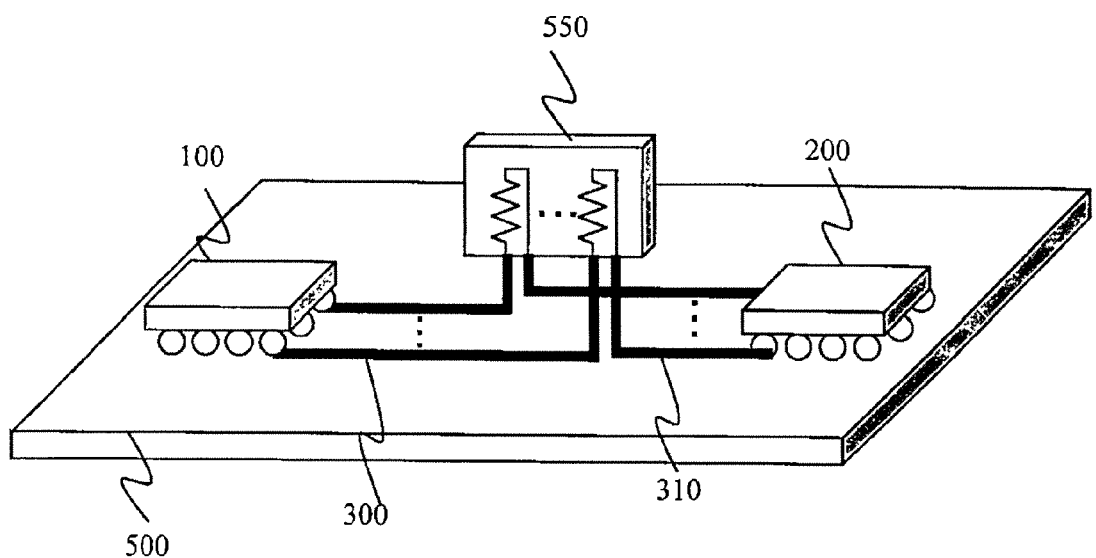
FIG. 7 is an example of a structural view of a signal transmission system of a third embodiment of the invention.

FIG. 7 shows a signal transmission system of a case where a resistance device inserted between a semiconductor device and a memory device is realized by a collective resistance device 550. The feature of embodiment 3 is that resistance devices inserted to plural signal lines between the semiconductor device and the memory device are realized by the collective resistance device, so that the mounting area can be saved.

Embodiment 4

In this embodiment, a description will be made on an example of a case where in a mounting form similar to embodiment 1, when plural memory devices are connected, a bus switch is used.

Figure 8:
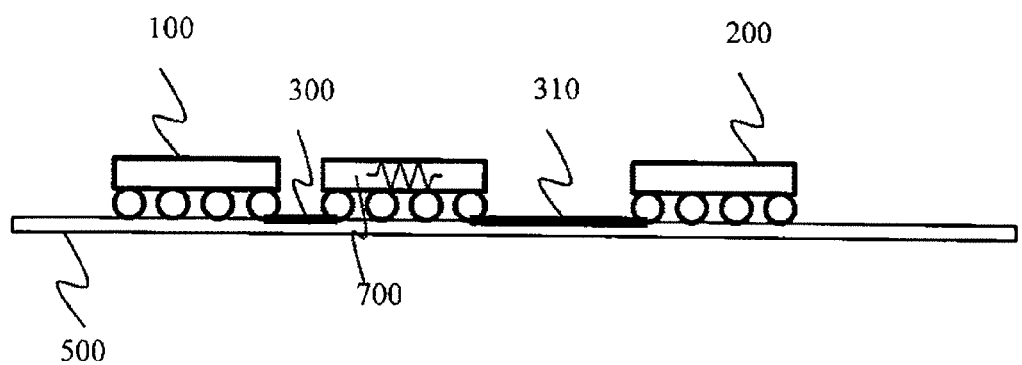
FIG. 8 is an example of a structural view of a signal transmission system of a fourth embodiment of the invention.

FIG. 8 shows a signal transmission system of a case where a bus switch 700 is inserted instead of the resistance device 400 inserted between the semiconductor device and the memory device in embodiment 1. The feature of embodiment 4 is that the bus switch 700 having a resistance component is used, so that the effect of embodiment 1 can be realized, the number of memory devices connectable to the semiconductor device 100 is increased, and enlargement of memory capacity can be realized.

Embodiment 5

In this embodiment, a description will be made on an example of a case where a semiconductor device 100 and a memory device 200 are mounted on different boards.

Figure 9:
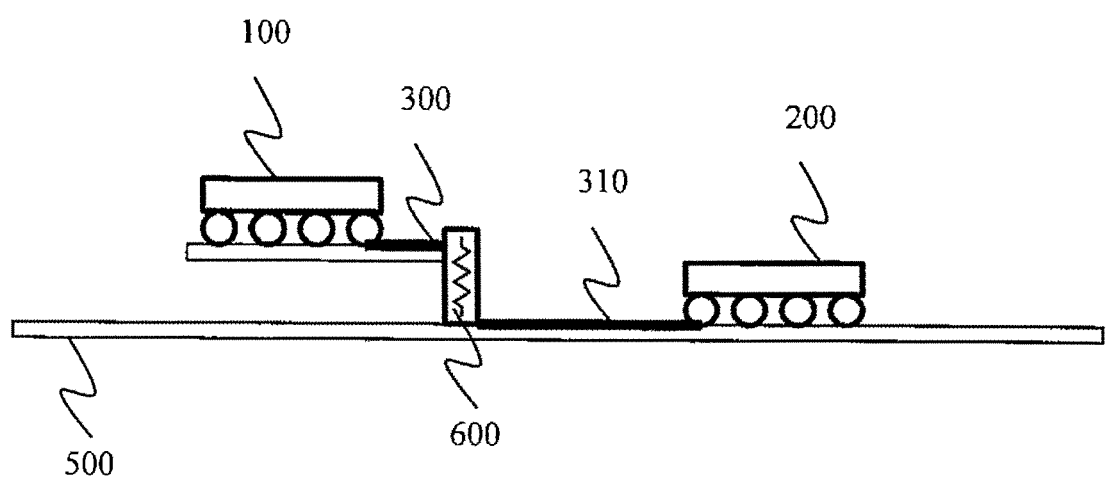
FIG. 9 is an example of a structural view of a signal transmission system of a fifth embodiment of the invention.

For example, the semiconductor device 100 is mounted on a main board 500, and the memory device is mounted on a DIMM board. FIG. 9 shows a signal transmission system of a case where a connector 600 intervenes between the semiconductor device and the memory device since the semiconductor device and the memory device are mounted on different boards. The feature of embodiment 5 is that since the connector 600 has a resistance component, the resistance device 400 described in embodiment 1 is unnecessary, and the mounting area can be reduced.

Embodiment 6

In this embodiment, a description will be made on an example of a case where in amounting form similar to embodiment 1, a resistance device to be inserted is mounted in a board.

Figure 10:
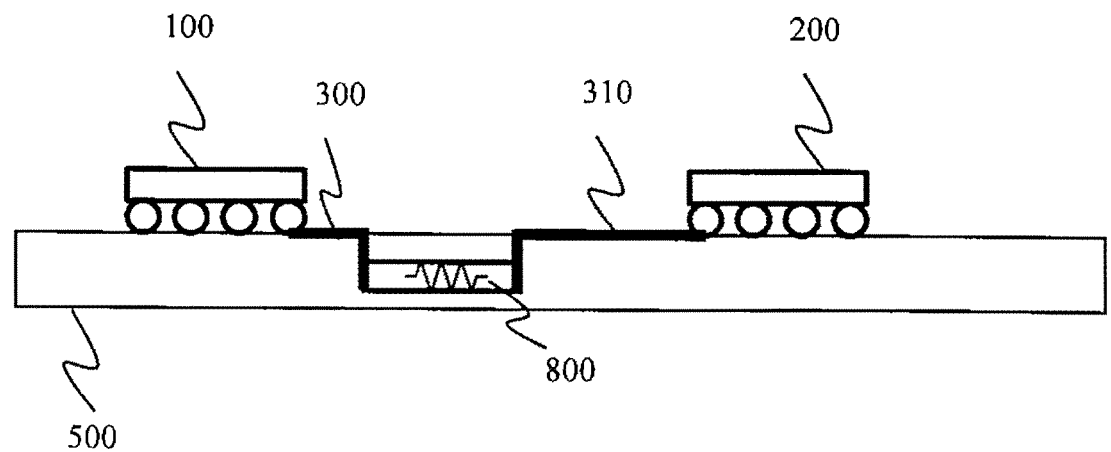
FIG. 10 is an example of a structural view of a signal transmission system of a sixth embodiment of the invention.

FIG. 10 shows a signal transmission system of a case where a resistance device 800 inserted between a semiconductor device 100 and a memory device 200 is mounted in a board. The feature of embodiment 6 is that since the resistance device 800 is mounted inside the board, the mounting area can be reduced, and the mounting area can be effectively used.

Embodiment 7

In this embodiment, a description will be made on an example of a case where the structure of embodiment 1 is applied to a differential signal transmission system.

Figure 11:
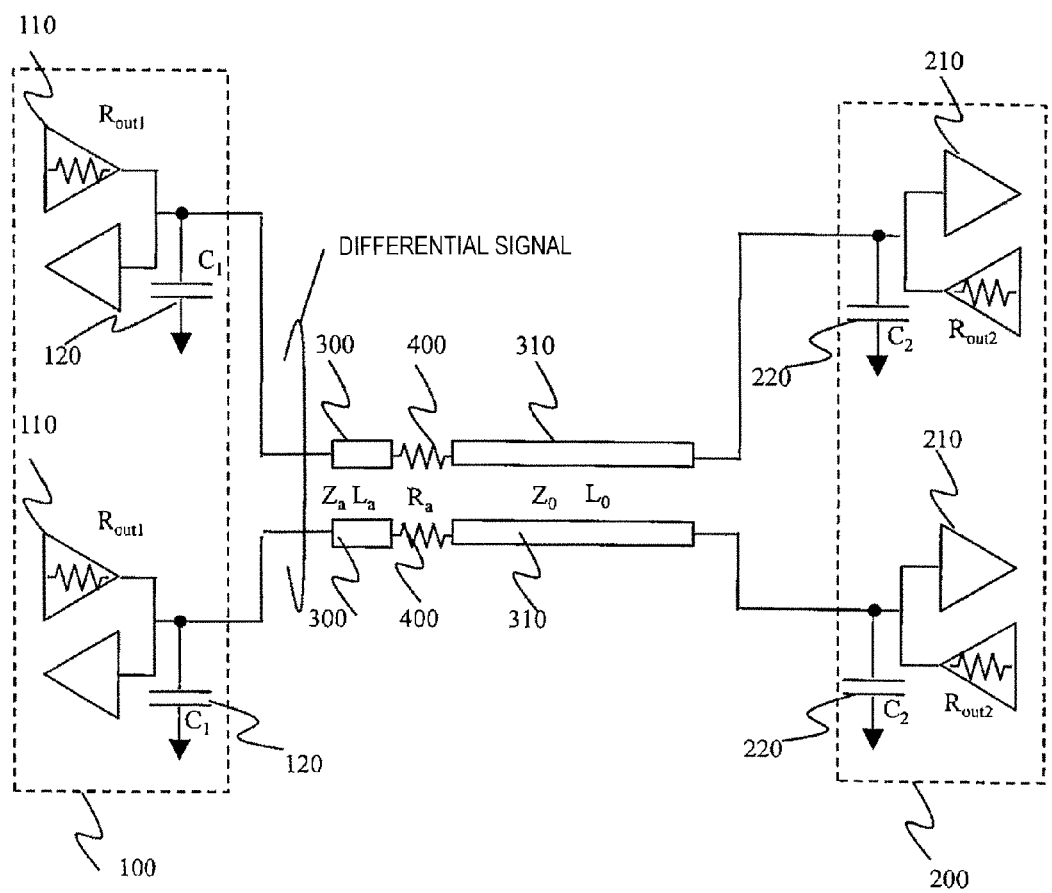
FIG. 11 is an example of a structural view of a signal transmission system of a seventh embodiment of the invention.

FIG. 11 shows a signal transmission system of, for example, a strobe signal in a case where a differential signal is transmitted between a semiconductor device 100 and a memory device 200. The feature of embodiment 7 is that the effect of embodiment 1 is obtained also in the differential signal transmission system.

Embodiment 8

In this embodiment, a description will be made on an example of a case where in a mounting form similar to embodiment 1, a termination resistor is connected.

Figure 12:
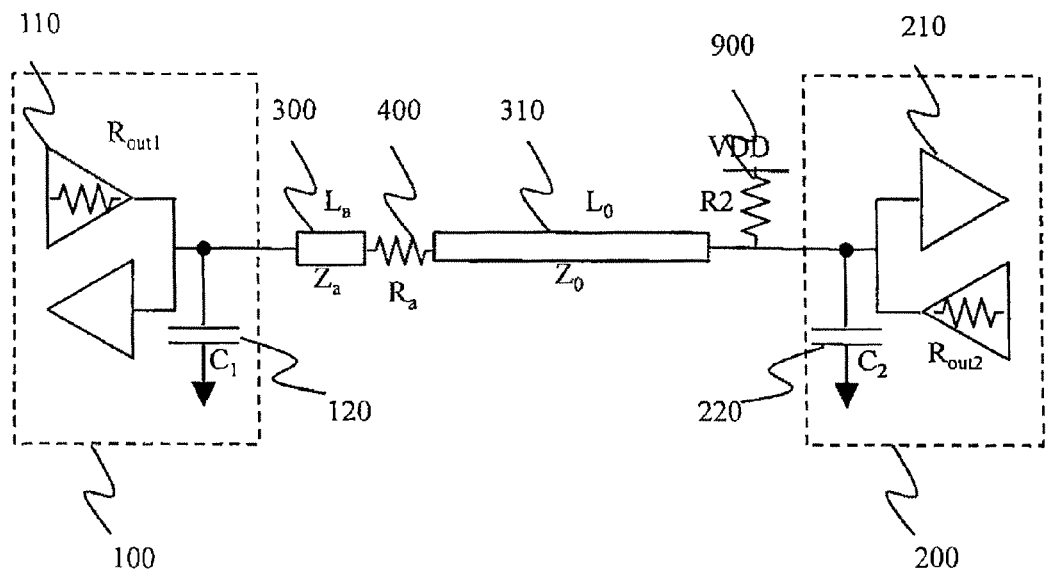
FIG. 12 is an example of a structural view of a signal transmission system of an eighth embodiment of the invention.
Figure 13:
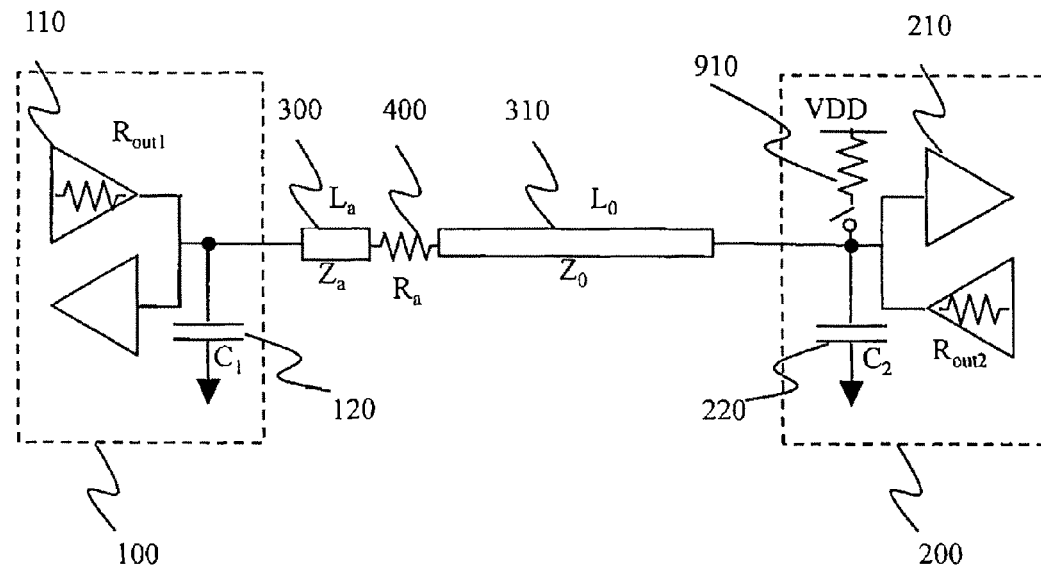
FIG. 13 is an example of a structural view of the signal transmission system of the eighth embodiment of the invention.

FIG. 12 shows a signal transmission system of a case where a receiving end of a memory device 200 is terminated by a resistance device. FIG. 13 shows a signal transmission system of a case where a memory device 200 has a built-in termination resistor.

The feature of embodiment 8 is that in addition to the effect of embodiment 1, reflection at the receiving end of the memory device 200 is suppressed by the termination resistor, and the signal quality can be improved.

The embodiments of the invention have been described. Incidentally, the invention is not limited to the above embodiments, and includes various modified examples. For example, the above embodiments are described in detail in order to explain the invention clearly, and all the described components are not necessarily indispensable. Besides, apart of a structure of an embodiment may be replaced by a structure of another embodiment. Besides, a structure of an embodiment can be added to a structure of another embodiment. Besides, with respect to part of the structures of the respective embodiments, addition, deletion and replacement of another structure can be performed.

Besides, the signal wirings and the devices of the respective structures are shown which are necessary for the description, and all signal wirings and components of respective structures of a product are not necessarily shown. Actually, the number of kinds of signal wiring topologies to connect the respective structures, and the number of devices of the respective structures may be two or more.

What is claimed is:

1. A semiconductor apparatus comprising:
    a first semiconductor device;
    a second semiconductor device having a larger load capacitance than the first semiconductor device; and
    a signal transmission path to connect the first semiconductor device and the second semiconductor device, wherein
    the signal transmission path includes a first wiring on a side of the first semiconductor device, a second wiring on a side of the second semiconductor device and a resistor between the first wiring and the second wiring,
    an impedance of the second wiring on the side of the second semiconductor device having the large load capacitance is larger than an impedance of the first wiring on the side of the first semiconductor device having the small load capacitance, and a length of the second wiring is longer than a length of the first wiring.

2. The semiconductor apparatus according to claim 1, wherein a signal transmitted from the first semiconductor device to the second semiconductor device is subjected to pre-emphasis.

3. The semiconductor apparatus according to claim 2, wherein a signal transmitted from the second semiconductor device to the first semiconductor device is not subjected to pre-emphasis or is slightly subjected to pre-emphasis.

4. The semiconductor apparatus according to claim 1, wherein
    the impedance of the first wiring is smaller then a sum of a resistance value of the resistor and the impedance of the second wiring, and
    the impedance of the second wiring is substantially equal to a sum of the resistance value of the resistor and the impedance of the first wiring.

5. The semiconductor apparatus according to claim 1, wherein
    when a transmission speed of a signal transmitted through the signal transmission path is v, and a period of the signal is T, a length La of the first wiring and a length Lo of the second wiring satisfy following mathematical expression (2) and mathematical expression (4):

$$La < 1T*v/2 \quad (2)$$

$$Lo > 1T*v/2 \quad (4).$$

6. The semiconductor apparatus according to claim 1, wherein
    the second semiconductor device is a memory device, and the first semiconductor device is a memory controller to control the memory.

7. The semiconductor apparatus according to claim 6, wherein the memory device is a flash memory.

8. The semiconductor apparatus according to claim 1, wherein the resistor is a resistance device or a collective resistance device.

9. The semiconductor apparatus according to claim 1, wherein the resistor is a resistor provided in a switching device or a connector.

10. The semiconductor apparatus according to claim 1, wherein the resistor is a resistor provided in a board.

11. The semiconductor apparatus according to claim 1, wherein a plurality of the signal transmission paths are provided to form a differential signal transmission path.

12. The semiconductor apparatus according to claim 1, further comprising a termination resistor on the side of the second semiconductor device relative to the second wiring.

13. The semiconductor apparatus according to claim 1, wherein
    a plurality of the second semiconductor devices are provided, the load capacitance of the second semiconductor device is a sum of load capacitances of the plurality of the second semiconductor devices, and
    the sum of the load capacitances is larger than the load capacitance of the first semiconductor device.

14. A signal transmission system comprising:
    a semiconductor device connection part connected to a semiconductor device as a memory controller;
    a memory device connection part connected to a memory device; and
    a signal transmission path to connect the semiconductor device connection part and the memory device connection part, wherein
    the signal transmission path includes a first wiring on a side of the semiconductor device connection part, a second wiring on a side of the memory device connection side and a resistor between the first wiring and the second wiring,
    an impedance of the second wiring on the side of the memory device connection part is larger than an impedance of the first wiring on the side of the semiconductor device connection part, and a length of the second wiring is longer than a length of the first wiring.

* * * * *